United States Patent [19]

Burch et al.

[11] Patent Number: 4,771,249

[45] Date of Patent: Sep. 13, 1988

[54] PHASE LOCKED LOOP HAVING A FILTER WITH CONTROLLED VARIABLE BANDWIDTH

[75] Inventors: Kenneth R. Burch, Austin; Wendell L. Little, Carrollton, both of Tex.

[73] Assignee: Motorola, Inc., Schaumburg, Ill.

[21] Appl. No.: 53,653

[22] Filed: May 26, 1987

[51] Int. Cl.$^4$ .......................... H03L 7/10; H03L 7/18
[52] U.S. Cl. .................... 331/17; 331/1 A; 331/8; 331/27
[58] Field of Search ................. 331/17, 1 A, 8, 27

[56] References Cited

U.S. PATENT DOCUMENTS 4,156,855 5/1979 Crowley .................... 331/17 X
4,506,233 3/1985 Englund, Jr. .................... 331/17

*Primary Examiner*—Siegfried H. Grimm
*Attorney, Agent, or Firm*—John A. Fisher; Jeffrey Van Myers; Robert L. King

[57] ABSTRACT

A phase locked loop (PLL) is provided having a filter with a programmable wide and narrow bandwith. When PLL circuit operation is initiated or when the operational frequency of the PLL is changed by a substantial amount, a phase detector functions to force the filter in a wide bandwith mode to allow fast circuit operation in the transient mode. After the PLL output has settled close to a predetermined frequency, the number of times the output frequency varies above and below the predetermined frequency before reaching a locked state is detected and counted. After the output frequency has varied above and below the predetermined frequency a predetermined number of times, the filter is automatically switched to a low bandwith mode to allow the PLL to operate in a stable manner.

9 Claims, 1 Drawing Sheet

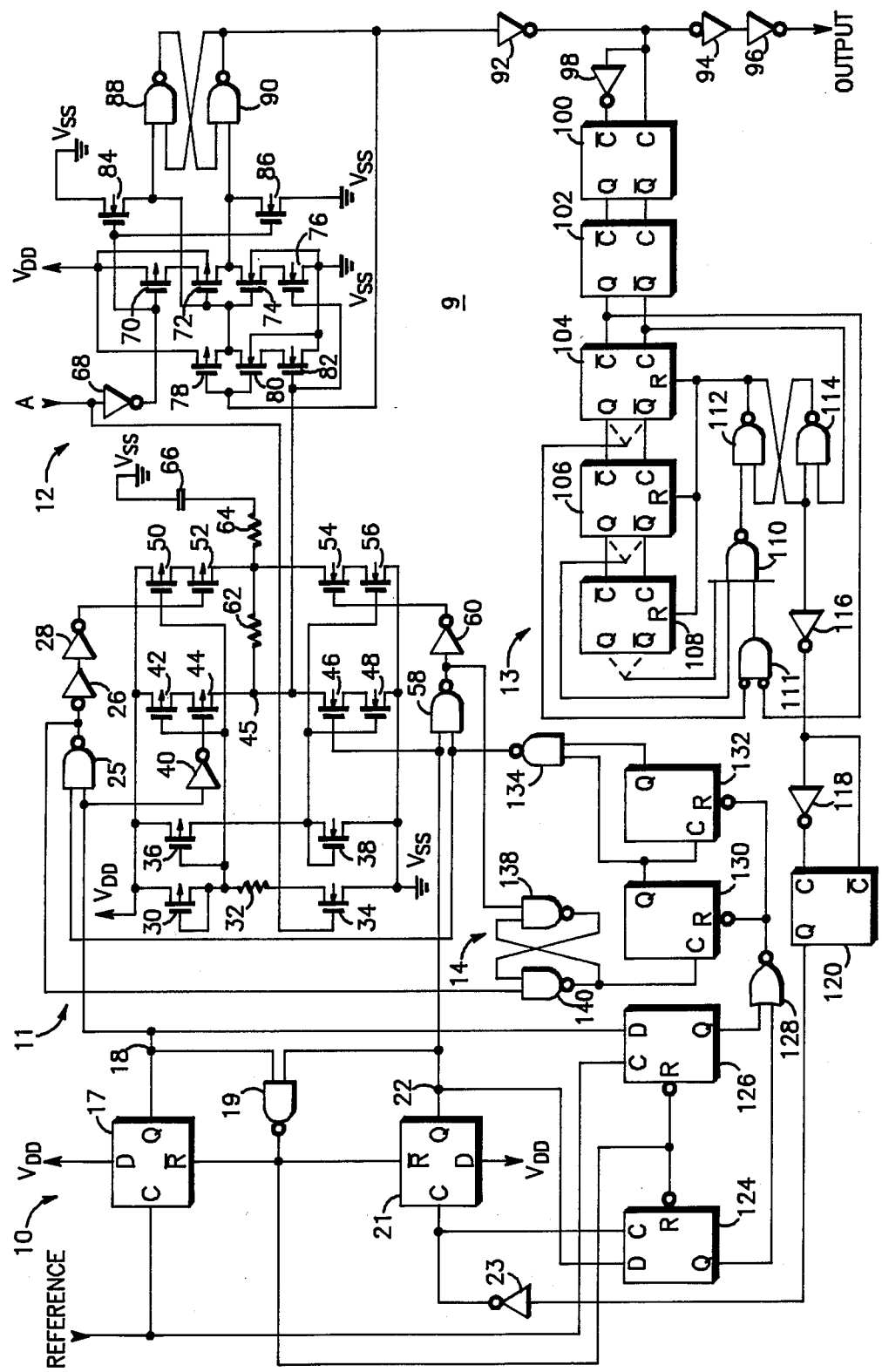

PHASE LOCKED LOOP HAVING A FILTER WITH CONTROLLED VARIABLE BANDWIDTH

TECHNICAL FIELD

This invention relates generally to filter circuits, and more particularly, to phase locked loop filter circuits.

BACKGROUND ART

Phase locked loops (PLLs) are commonly used in electronic microcontroller systems and other communication systems. Phase locked loops fundamentally function by receiving a predetermined reference frequency and providing a locked output frequency having a frequency which is a predetermined multiple of the reference frequency. A phase detector is typically used to compare the frequency of the reference with the locked output frequency after being divided by the predetermined multiple. The phase detector provides a control signal which is proportional to an error between the two frequencies being compared. The control signal is typically filtered by a filter to derive a control voltage for controlling a voltage controlled oscillator (VCO). The voltage controlled oscillator provides the locked output frequency. A frequency divider circuit is coupled to the VCO and to the phase detector to complete a circuit loop. The frequency divider divides the output signal frequency by the predetermined multiple for use by the phase comparator.

Previously, PLLs have not been very successful in providing both fast startup operation and stable operation because the two characteristics were mutually exclusive. Others have used a filter with a large bandwidth to achieve a locked output frequency quickly. However, the large bandwidth filter may create frequency stability problems. Another PLL technique which has been used is to utilize two filter circuits wherein a first filter has a large bandwidth and is used initially to establish quick circuit operation at a locked frequency and a second filter having a more narrow bandwidth is later substituted for subsequent stable circuit operation. Selection of the filter may be made by either a timed switching arrangement or by software control. A problem with the use of two filters of varying bandwidth is associated with the difficulty of determining when the loop first achieves a lock condition. Software controlled filter systems are typically cumbersome and slow.

BRIEF DESCRIPTION OF THE INVENTION

Accordingly, an object of the present invention is to provide an improved phase locked loop (PLL) circuit.

Another object of the present invention is to provide an improved PLL having fast startup capability and stable operating characteristics.

Yet another object of this invention is to provide an improved method of controlling loop filter bandwidth in a phase locked loop.

In carrying out the above and other objects of the present invention, there is provided, in one form, a phase locked loop circuit which provides an output signal which is locked to a predetermined frequency. An input portion has a first input for receiving a reference frequency and has a second input for receiving a fundamental frequency of the output signal. The input portion compares the phase of the reference and fundamental frequencies and provides first and second phase signals indicating the phase of each frequency with respect to the other frequency. A filter having a bandwidth is coupled to the input portion for receiving the first and second phase signals and filtering the reference frequency to provide a control signal. The control signal has an amplitude which is proportional to the first and second phase signals. An oscillator is coupled to the filter and provides the output signal in response to the control signal. A frequency divider is coupled to the output of the oscillator and divides the output signal by a predetermined multiple to provide the fundamental frequency. A control portion is coupled to the filter for controlling the bandwidth of the filter by setting the bandwidth at a first value in response to the first and second phase signals. The control portion sets the bandwidth of the filter at a second value in response to detecting the output signal respectively exceeding and dropping below the predetermined frequency a predetermined number of times.

These and other objects, features and advantages will be more clearly understood from the following detailed description taken in conjunction with the accompanying drawings.

BRIEF DESCRIPTION OF THE DRAWING

The single FIGURE illustrates in partial schematic form a phase locked loop in accordance with the present invention.

DETAILED DESCRIPTION OF THE INVENTION

Shown in FIG. 1 is a phase locked loop 9 generally comprising a phase comparator portion 10, a filter portion 11, a voltage controlled oscillator portion 12, a frequency divider portion 13, and a counter control portion 14. Although specific N-channel and P-channel MOS devices are shown, it should be clear that phase locked loop 9 may be implemented by completely reversing the processing techniques (e.g. P-channel to N-channel) or by using other types of transistors.

Phase comparator portion 10 comprises a D-type flip-flop 17 having a data input labeled "D" connected to a power supply voltage labeled "$V_{DD}$". A clock input of flip-flop 17 is coupled to a reference frequency labeled "Reference". A data output labeled "Q" of flip-flop 17 is connected to a first input of a NAND gate 19 via a node 18. An output of NAND gate 19 is connected to a complementary reset input labeled "$\overline{R}$" of both flip-flop 17 and a flip-flop 21. A data input of flip-flop 21 is connected to power supply voltage $V_{DD}$. A data output labeled "Q" of flip-flop 21 is connected to a second input of NAND gate 19 via a node 22. An inverter 23 has an output connected to a clock input of flip-flop 21.

Filter portion 11 comprises a NAND gate 25 having a first input connected to the Q data output of flip-flop 17 at node 18. An output of NAND gate 25 is connected to an input of an inverter 26. An output of inverter 26 is connected to an input of an inverter 28. A P-channel transistor 30 has a source connected to power supply voltage $V_{DD}$, and has both a gate and a drain connected together. The drain of transistor 30 is connected to a first terminal of a resistor 32. A second terminal of resistor 32 is connected to a drain of an N-channel transistor 34. A source of transistor 34 is connected to a ground reference terminal labeled "$V_{SS}$". In the illustrated form, $V_{DD}$ has a more positive voltage potential than $V_{SS}$. A P-channel transistor 36 has a source connected to power supply voltage $V_{DD}$, a gate connected to the drain of transistor 30, and a drain connected to both a drain and a gate of an N-channel transistor 38. A source of transistor 38 is connected to the ground reference terminal $V_{SS}$. An input of an inverter 40 is connected to the first input of NAND gate 25. A P-channel transistor 42 has a source connected to power supply voltage $V_{DD}$, a gate connected to the drain of transistor 30, and a drain connected to a source of a P-channel transistor 44. An output of inverter 40 is connected to a gate of transistor 44. A drain of transistor 44 is connected to a drain of an N-channel transistor 46 via a node 45. A source of transistor 46 is connected to a drain of an N-channel transistor 48. A gate of transistor 48 is connected to the gate of transistor 38, and a source of transistor 48 is connected to the ground reference terminal $V_{SS}$. A P-channel transistor 50 has a source connected to power supply voltage $V_{DD}$, a gate connected to the drain of transistor 30, and a drain connected to a source of a P-channel transistor 52. A gate of transistor 52 is connected to an output of inverter 28, and a drain of transistor 52 is connected to a drain of an N-channel transistor 54. A source of transistor 54 is connected to a drain of an N-channel transistor 56. A gate of transistor 56 is connected to the gates of transistors 38 and 48, and a source of transistor 56 is connected to the ground reference terminal $V_{SS}$. A NAND gate 58 has a first input connected to node 22, and has a second input connected to a second input of NAND gate 25. An output of NAND gate 58 is connected to an input of an inverter 60. An output of inverter 60 is connected to a gate of transistor 54. A resistor 62 has a first terminal connected to node 45, and a second terminal connected to both the drain of transistor 52 and a first terminal of a resistor 64. A second terminal of resistor 64 is connected to a first electrode of a capacitor 66. A second electrode of capacitor 66 is connected to ground reference terminal $V_{SS}$.

Voltage controlled oscillator portion 12 comprises an inverter 68 having an input for receiving an on/off control signal labeled "A". An output of inverter 68 is connected to a gate of a P-channel transistor 70. A source of transistor 70 is connected to power supply voltage $V_{DD}$, and a drain of transistor 70 is connected to a source of a P-channel transistor 72. A drain of transistor 72 is connected to a drain of an N-channel transistor 74. A gate of transistor 74 is connected to a gate of transistor 72. A substrate of transistor 74 is connected to the reference ground potential $V_{SS}$. A source of transistor 74 is connected to a drain of an N-channel transistor 76. A source of transistor 76 is connected to the reference ground potential $V_{SS}$. A P-channel transistor 78 has a source connected to power supply voltage $V_{DD}$, and has a drain connected to both a drain of an N-channel transistor 80 and the gates of transistors 72 and 74. A gate of transistor 80 is connected to the gate of transistor 78. A source of transistor 80 is connected to a drain of an N-channel transistor 82. A substrate of transistor 80 is connected to the reference ground potential $V_{SS}$. A gate of transistor 82 is connected to a gate of transistor 76, and a source of transistor 82 is connected to the reference ground potential $V_{SS}$. An N-channel transistor 84 has a drain connected to the reference ground potential $V_{SS}$, and has a gate connected to a gate of N-channel transistor 86. A source of transistor 84 is connected to the gates of transistors 72 and 74 and to a first input of a NAND gate 88. An output of NAND gate 88 is connected to a first input of a NAND gate 90.

A second input of NAND gate 88 is connected to an output of NAND gate 90. A drain of transistor 86 is connected to the drain of transistor 72 and to a second input of NAND gate 90. A source of transistor 86 is connected to the reference ground potential $V_{SS}$. An output of NAND gate 90 is connected to both an input of an inverter 92 and to the gates of transistors 78 and 80.

Frequency divider portion 13 comprises an inverter 94 having an input connected to the output of inverter 92. An output of inverter 94 is connected to an input of an inverter 96. An output of inverter 96 provides an output signal of phase locked loop 9 which is locked to a predetermined frequency. An inverter 98 has an input connected to the output of inverter 92, and has an output connected to a complementary clock input of a toggle flip-flop circuit 100. The output of inverter 92 is connected to a clock input of toggle flip-flop circuit 100. A data output of flip-flop circuit 100 labeled "Q" is connected to a complementary clock input of a toggle flip-flop circuit 102. A complementary data output of flip-flop circuit 100 is connected to a clock input of flip-flop circuit 102. A data output of flip-flop circuit 102 is connected to a complementary clock input of a toggle flip-flop 104. A complementary data output of flip-flop circuit 102 is connected to a clock input of flip-flop circuit 104. A data output of flip-flop circuit 104 is connected to a complementary clock input of a toggle flip-flop circuit 106. A complementary data output of flip-flop circuit 104 is connected to a clock input of flip-flop circuit 106. A data output of flip-flop circuit 106 is connected to a complementary clock input of a toggle flip-flop circuit 108. A complementary data output of flip-flop circuit 106 is connected to a clock input of flip-flop circuit 108. Each of flip-flop circuits 104, 106 and 108 has a reset input, and the reset inputs are connected together. Both a data output and a complementary data output of flip-flop circuit 108 are programmably coupled to a first input of a NAND gate 110 as indicated by a dashed line. Both the data output and the complementary data output of flip-flop circuit 106 are programmably coupled to a second input of NAND gate 110 as is also indicated by a dashed line. Both the data output and the complementary data output of flip-flop circuit 104 are programmably coupled to a first complementary input of a NAND gate 111 as is also indicated by a dashed line. The data output of flip-flop circuit 102 is connected to a second complementary input of NAND gate 111. An output of NAND gate 111 is connected to a third input of NAND gate 110. An output of NAND gate 110 is connected to a first input of a NAND gate 112. An output of NAND gate 112 is connected to a first input of a NAND gate 114 and to the connected reset inputs of flip-flop circuits 104, 106 and 108. The output of NAND gate 112 is also connected to an input of an inverter 116. An output of NAND gate 114 is connected to a second input of NAND gate 112. A second input of NAND gate 114 is connected to the complementary data output of flip-flop circuit 102. An output of inverter 116 is connected to an input of an inverter 118 and to a complementary clock input of a toggle flip-flop 120. An output of inverter 118 is connected to a clock input of flip-flop 120. Flip-flop 120 has a data output labeled "Q" connected to an input of inverter 23. It should be well understood that toggle flip-flops 100, 102, 104, 106, 108 and 120 may be implemented by conventional D-type flip-flop circuits having a data input connected to the complementary data output (not shown).

Counter control portion 14 comprises a D-type flip-flop 124 having a data input labeled "D" connected to node 22, and a clock input labeled "C" connected to the output of inverter 23. A D-type flip-flop 126 has a data input labeled "D" connected to node 18, and a clock input labeled "C" connected to the input reference frequency. Flip-flops 124 and 126 each have a reset input labeled "R" connected together and connected to the output of NAND gate 19. A data output of flip-flop 126 labeled "Q" is connected to a first input of a NOR gate 128, and a data output of flip-flop 124 also labeled "Q" is connected to a second input of NOR gate 128. An output of NOR gate 128 is connected to reset inputs labeled "R" of toggle flip-flops 130 and 132. A data output labeled "Q" of flip-flop 130 is connected to both a clock input of flip-flop 132 and a first input of a NAND gate 134. A data output also labeled "Q" of flip-flop 132 is connected to a second input of NAND gate 134. An output of NAND gate 134 is connected to a second input of NAND gate 58. A NAND gate 138 has a first input connected to the output of NAND gate 58, and an output connected to a first input of a NAND gate 140. A second input of NAND gate 140 is connected to the output of NAND gate 25. An output of NAND gate 140 is connected to a second input of NAND gate 138 and to a clock input labeled "C" of flip-flop 130.

In operation, signal A is an on/off control signal which allows phase locked loop 9 to operate. Phase locked loop 9 is enabled when signal A has a high logic value. A stable reference frequency is coupled to the clock input of flip-flop 17 which clocks flip-flop 17 at a predetermined rate. The output frequency from counter control portion 13 functions to simultaneously clock flip-flop 21. Initially when circuit operation begins, flip-flop 17 is clocked at a much higher rate of frequency than flip flop 21 because the output frequency is in a period of transition from zero to the predetermined locked output frequency. Therefore, the output signal of flip-flop 17 at node 18 is at a high logic state for a period of time before the output of flip-flop 21 transitions to a high logic state. When the outputs of both flip-flops 17 and 21 are at a high logic state, NAND gate 19 functions to reset both flip-flops 17 and 21 causing nodes 18 and 22 to return to a logic low level. However, until node 22 transitions to a high logic level, node 18 remains at a high logic level. When node 18 is at a high logic state, NAND gate 25 is providing a high logic level output because the second input of NAND gate 25 is also at a high logic state from the output of NAND gate 134. The reason for this assumed logic state will be explained below in connection with the operation of counter control portion 14. Inverters 26 and 28 provide additional drive capability and couple the logic high state of NAND gate 25 to the gate of transistor 52. Control signal A simultaneously is making transistor 34 conductive. Transistor 30 functions to create a current reference from which other currents in filter portion 11 are ratioed. Transistors 30 and 34 and resistor 32 function as a current generator to source and sink a predetermined first current. The voltage derived across transistor 30 is used to bias transistor 50. Therefore, when transistor 52 is biased from inverter 28, transistors 50 and 52 source current via resistor 64 to charge up capacitor 66. The voltage across capacitor 66 is used to provide an output control voltage which is coupled to the gates of transistors 82 and 76 of voltage controlled oscillator 12.

In the illustrated form, transistors 36 and 38 function to conduct a second predetermined current which is substantially equal to the first predetermined current conducted by transistors 30 and 34. Therefore, transistors 30 and 36 and transistors 34 and 38 are respectively size ratioed. Transistors 42 and 44 function as a current source having a current value referenced to the first and second predetermined currents. Transistors 46 and 48 function as a current sink also having a current value referenced to the first and second predetermined currents. When control signal A allows phase locked loop 9 to be operative, transistors 42, 48, 50 and 56 are continuously conductive. When series-connected control transistors 44 and 46 and control transistors 52 and 54 are all nonconductive, capacitor 66 is allowed to "float" in value. Similarly, transistors 50 and 52 function as a current source having a current value referenced to the first and second predetermined currents. Transistors 54 and 56 function as a current sink having a current value also referenced to the first and second predetermined currents. Therefore, transistors 50, 52 and transistors 54, 56 collectively function as a current source/current sink to capacitor 66. Transistors 42, 44, 46 and 48 are size ratioed to conduct a small amount of current, whereas transistors 50, 52, 54 and 56 are size ratioed to conduct a large amount of current. As a result, transistors 50, 52 and transistors 54, 56 may be used to respectively source or sink a large amount of current to or from capacitor 66 when the output frequency changes dramatically requiring a wide filter bandwidth. In contrast, transistors 42, 44 and transistors 46, 48 may be used to respectively source or sink a small amount of current to or from capacitor 66 when the output frequency changes by a small amount requiring only a narrow filter bandwidth.

When circuit operation is initiated, the output frequency transitions dramatically from zero to a predetermined frequency. Therefore, initially filter portion 11 needs to have a wide bandwidth. As a result, transistors 50 and 52 which provide a large source current are initially utilized to charge capacitor 66. As the voltage on capacitor 66 increases, the control voltage provided to oscillator portion 12 increases, thereby causing the frequency of oscillator portion 12 to rise. Frequency divider portion 13 divides the output frequency which is provided by oscillator portion 12 by a predetermined integer multiple. As soon as the predetermined multiple of frequency has been counted, divider portion 13 provides an output signal which is used to clock flip-flop 21. When flip-flop 21 is clocked, the output of flip-flop 21 transitions to a high logic level. As soon as node 22 transitions to a high logic level, the output of NAND gate 19 transitions to a high logic level which resets flip-flops 17 and 21 making the logic levels of flip-flops 17 and 21 both transition to low logic levels. At this point, transistor 52 is nonconductive and transistor 54 is conductive, thereby sinking current from capacitor 66 and discharging capacitor 66. As soon as another cycle of the input reference frequency occurs, flip-flop 17 is clocked again to force the output of flip-flop 17 at node 18 to a high logic level. The clocking of flip-flop 17 forces transistors 50 and 52 to again become conductive and transistors 54 and 56 to become nonconductive. Transistors 50 and 52 continue to charge capacitor 66 to a higher voltage to allow oscillator portion 12 to increase the output frequency. Meanwhile, transistors 42, 44, 46 and 48 of the low bandwidth portion of filter portion 11 remain nonconductive. After oscillator portion 12 increases the frequency to the desired predetermined frequency, frequency divider portion 13 again provides an output signal which clocks flip-flop 21 causing both nodes 18 and 22 to have a high logic level. After NAND gate 19 again resets flip-flops 17 and 21, nodes 18 and 22 are both at a low logic level. When nodes 18 and 22 are at a low logic level, the voltage potential across capacitor 66 is allowed to float because neither transistor 52 or transistor 54 is conductive. Should the phase locked output frequency happen to increase in value above the predetermined frequency, node 22 will transition to a high logic level before node 18 will transition to a high logic level. In response thereto, NAND gate 58 and inverter 60 make transistor 54 conductive, and current is drained away from capacitor 66 to reduce the voltage on capacitor 66. Accordingly, the output voltage of filter portion 11 decreases which lowers the output frequency of oscillator portion 12. When the next cyle of the input reference frequency clocks flip-flop 17, node 18 transitions to a high logic level and flip-flops 17 and 21 are reset. Transistors 52 and 54 are again nonconductive which allows the voltage potential of capacitor 66 to float. The values of resistors 62 and 64 of filter portion 11 establish, in part, the frequency characteristics of filter portion 11.

As a control voltage is coupled from filter portion 11 to voltage controlled oscillator portion 12, the output of portion 12 increases from zero at startup to the predetermined output frequency. Transistors 78 and 80 function as an inverter to invert the output signal which is used as a feedback signal in response to transistor 82 being conductive. The amount of current which transistors 78, 80 and 82 conduct is related to the voltage of capacitor 66 which is coupled to transistor 82. Transistor 82 also functions to control the conductive "on" impedance of the inverter comprising transistors 78 and 80 thereby affecting the speed of operation of transistors 78 and 80. Transistors 72, 74 and 76 further amplify the feedback signal in a manner analogous to transistors 78, 80 and 82, respectively. Transistor 70 functions as an on/off switch for portion 12 in response to control signal A. Transistors 84 and 86 are controlled by signal A and function to ensure that the inputs to NAND gates 88 and 90 do not float when oscillator portion 12 is turned off. NAND gates 88 and 90 provide an odd number of inversions from the input to the output of oscillator portion 12. NAND gate 90 provides the output signal, whereas NAND gate 88 insures that the output of NAND gate 90 actually varies fully between the $V_{DD}$ and $V_{SS}$ potentials. The feedback from the output of NAND gate 90 to the second input of NAND gate 88 further insures that the output of portion 12 varies between $V_{DD}$ and $V_{SS}$.

In the illustrated form, three more stages of inversion occur thru inverters 92, 94 and 96 before an output frequency having a phase locked to the reference frequency is provided. Inverter 98 of frequency divider portion 13 provides a complementary clock input for flip-flop 100. Flip-flop 100 squares up the output signal of oscillator portion 12 to insure that the signal has a fifty percent duty cycle as opposed to being a very narrow pulse. Flip-flops 102, 104, 106 and 108 form a modulo counter and set the divide modulus of divider portion 13. A conventional nitride option is utilized to couple one of the Q or $\overline{Q}$ outputs of flip-flops 104, 106 and 108 to either NAND gate 110 or NAND gate 111.

By using the three flip-flops 104, 106 and 108, a three-bit modulo N divider is created, where N is any integer value between one and eight. The divide number is equal to the factor by which the reference frequency has been multiplied to provide the phase locked output signal. The actual count which is accomplished with the modulo counter is decoded by NAND gates 110 and 111. NAND gates 112 and 114 reset the modulo counter for one-half of a clock cycle and the counter is again released to begin counting again. Therefore, divider portion 13 measures the count obtained by the modulo counter on one clock edge and decodes the count on another clock edge. Inverter 116 functions as a buffer stage to drive the next stage. Flip-flop 120 squares up the output of divider portion 13 to provide a signal having a fifty percent duty cycle.

The output of frequency divider portion 13 is connected to the clock input of flip-flop 21 via inverter 23 as a feedback signal which is supposed to be equal to the input reference frequency if the output signal is locked at the correct predetermined frequency. Flip-flops 124 and 126 function to detect a gross difference in frequency between the input reference frequency and the feedback frequency. If the two frequencies ever differ by a factor of two or more, flip-flops 124 and 126 function with NOR gate 128, flip-flops 130 and 132 and NAND gate 134 to place filter portion 11 in a wide bandwidth mode. The wide bandwidth mode occurs when the output of NAND gate 134 is at a logic high level which was the logic state previously assumed when circuit operation was beginning. Flip-flop 126 detects when the input reference frequency is more than twice the frequency of the feedback signal by clocking a high logic level at node 18 to NOR gate 128 if two high logic levels of the reference signal occur before one high logic level of the feedback signal occurs. Flip-flop 124 detects when the feedback signal is more than twice the input reference frequency by clocking a high logic level at node 22 to NOR gate 128 if two high logic levels of the feedback signal occur before one high logic level of the reference signal occurs. NOR gate 128 provides a reset signal to flip-flops 130 and 132 in response to the detection of either signal having a frequency which is more than twice the frequency of the other signal. Simultaneously, NAND gates 138 and 140 function to detect every time the feedback signal overshoots or exceeds the reference frequency in value. NAND gates 138 and 140 provide an output which is coupled to the clock input of flip-flop 130. NAND gates 138 and 140 form a set/reset flip-flop where NAND gate 138 is the set device and NAND gate 140 is the reset device. Each logic high level of the output of NAND gates 138 and 140 indicates when the feedback signal has overshot and undershot the reference frequency. Flip-flops 130 and 132 count the number of overshots and undershots. In the implementation shown, three overshots and undershots are counted because the two flip-flops 130 and 132 are used to form a counter. After three overshots, including three undershots, have been counted, the ratio between the feedback frequency and the reference frequency must again differ by more than a factor of two before the counter formed by flip-flops 130 and 132 is reset. After flip-flops 130 and 132 have counted three overshots and three undershots, NAND gate 134 transitions from a high logic level output to a low logic level output. In response thereto, filter portion 11 changes to the previously discussed low bandwidth mode. NAND gates 25 and 58 provide low logic level outputs in the low bandwidth mode.

The present invention may be readily expanded to include an optional frequency lock detection indication feature. Such a feature provides an indication as to when the output frequency is actually locked. The lock detection feature may be implemented by duplicating the circuitry of control portion 14 comprising NAND gates 138 and 140 and flip-flops 130 and 132 and NAND gate 134. The duplicated circuitry would be configured in an analogous manner as illustrated in the Figure with inputs of the duplicated NAND gates 138 and 140 being configured as NAND gates 138 and 140 are configured. Similarly, a NAND gate which duplicates NAND gate 134 would provide an output which indicates locked output frequency operation. Instead of duplicating flip-flops 130 and 132 exactly, more than two flip-flops may be desired to adequately insure that more than three overshoots and three undershoots have been counted before a locked frequency condition is indicated.

In the illustrated form, phase locked loop 9 is therefore able to programmably change frequency from a wide bandwidth to a low bandwidth in response to detecting how many times the output signal is overshooting the intended output value. Therefore, both start-up time and stability are optimized. By detecting and counting the number of overshoots and undershoots of the output frequency above and below the predetermined output frequency, the correct loop filter bandwidth is automatically selected during and after start-up and when the input reference frequency otherwise changes. The number of overshoots and undershoots to be counted by the PLL may be selected by a designer to optimize the filter bandwidth characteristics.

While an embodiment has been disclosed using certain assumed parameters, it should be understood that certain obvious modifications to the circuit or the given parameters will become apparent to those skilled in the art, and the scope of the invention should be limited only by the scope of the claims appended hereto.

We claim:

1. A phase locked loop circuit for providing an output signal which is locked to a predetermined frequency, comprising:
    input means having a first input for receiving a reference frequency and a second input for receiving a fundamental frequency of the output signal, said input means comparing the phase of the reference and fundamental frequencies and providing first and second phase signals indicating the phase of each frequency with respect to the other frequency;
    filter means having a bandwidth and coupled to the input means for receiving the first and second phase signals and filtering the reference frequency to provide a control signal, said control signal having an amplitude proportional to the first and second phase signals;
    oscillator means having an input coupled to the filter means for receiving the control signal, and an output for providing the output signal in response to the control signal;
    frequency divider means coupled to the output of the oscillator means, for receiving the output signal and dividing the output signal by a predetermined multiple to provide the fundamental frequency; and
    control means coupled to the filter means for controlling the bandwidth of the filter means by setting the bandwidth at a first value in response to the first and second phase signals and setting the bandwidth at a second value in response to detecting the output signal resepectively exceeding and dropping below the predetermined frequency a predetermined number of times.

2. The phase locked loop of claim 1 wherein the control means further comprise:
    detection means coupled to the filter means for detecting when one of the reference frequency or the fundamental frequency has a greater magnitude; and
    counter means coupled to the detection means, for counting a predetermined number of times the output signal exceeds and drops below the predetermined frequency.

3. The phase locked loop of claim 2 wherein the predetermined number counted by the counter means is three.

4. The phase locked loop of claim 1 wherein the first value of the bandwidth set by the control means is substantially larger in magnitude than the second value.

5. A method for controlling bandwidth in a filter of a phase locked loop to improve speed and stability, comprising the steps of:
    receiving an input reference frequency;
    filtering the input reference frequency to provide a control voltage;
    coupling the control voltage to an oscillator circuit to provide an output signal which is phase locked to the input reference frequency, said output signal having a frequency varying in proportion to the control signal;
    dividing the output signal by an integer multiple to provide a feedback frequency having a fundamental frequency of the output signal;
    comparing the phase of the input reference frequency with the phase of the feedback frequency;
    placing the filter in a first predetermined bandwidth in response to the compared phase being greater than a predetermined ratio;
    detecting when the output signal exceeds and falls below a predetermined frequency a predetermined number of times; and
    placing the filter in a second predetermined bandwidth in response to the detection of the output signal exceeding and falling below the predetermined frequency the predetermined number of times.

6. The method of claim 5 wherein the predetermined number of times to detect the output signal exceeding and falling below the predetermined frequency is three.

7. A phase locked loop circuit having a filter with controlled variable bandwidth, comprising:
    phase detection means having a first input for receiving a reference frequency and a second input for receiving a feedback signal, said phase detection means comparing the phase of the reference and feedback signals and providing first and second phase signals indicating the phase of each frequency with respect to the other frequency;
    filter means coupled to the phase detection means, said filter means filtering the reference frequency to provide a control signal having an amplitude proportional to the first and second phase signals;

oscillator means having an input coupled to the filter means for receiving the control signal, and an output for providing an output signal of predetermined frequency phase locked to the reference frequency and in response to the control signal;

frequency divider means coupled to the output of the oscillator means, for receiving the output signal and dividing the output signal by a predetermined multiple to provide the feedback signal; and control means coupled to the filter means for varying the bandwidth of the filter means between a wide bandwidth mode and a narrow bandwidth mode, said wide bandwidth mode being used whenever the reference frequency and the feedback frequency differ in frequency by more than a predetermined amount and said narrow bandwidth mode being used after the output signal has exceeded and fallen below a predetermined output frequency a predetermined number of times.

8. The phase locked loop circuit of claim 7 wherein said wide bandwidth mode is used when the reference frequency and the feedback frequency differ by at least a factor of two or more.

9. The phase locked loop circuit of claim 7 wherein the narrow bandwidth mode is used after the output signal exceeds and falls below the output frequency three times.

* * * * *